United States Patent
Totani (10) Patent No.: US 10,566,495 B2
(45) Date of Patent: Feb. 18, 2020

(54) METHOD FOR PRODUCING LIGHT-EMITTING DEVICE

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 30 days.

(21) Appl. No.: 16/114,574

(22) Filed: Aug. 28, 2018

(65) Prior Publication Data

US 2019/0081205 A1    Mar. 14, 2019

(30) Foreign Application Priority Data

Sep. 11, 2017  (JP) .................. 2017-174325

(51) Int. Cl.
  *H01L 33/00* (2010.01)
  *H01L 33/26* (2010.01)
  *H01L 33/24* (2010.01)
  *H01L 33/42* (2010.01)
  *H01L 33/44* (2010.01)

(52) U.S. Cl.
  CPC .......... *H01L 33/0095* (2013.01); *H01L 33/24* (2013.01); *H01L 33/26* (2013.01); *H01L 33/42* (2013.01); *H01L 33/44* (2013.01)

(58) Field of Classification Search
  CPC .................................................. H01L 33/0095
  See application file for complete search history.

(56) References Cited

U.S. PATENT DOCUMENTS

| 2016/0013361 | A1* | 1/2016 | Chiu | H01L 33/0095 |
| | | | | 257/98 |
| 2018/0345418 | A1* | 12/2018 | Lei | H01L 21/6836 |
| 2019/0006256 | A1* | 1/2019 | Huang | H01L 23/3128 |

FOREIGN PATENT DOCUMENTS

| JP | 2007-142277 A | 6/2007 |
| JP | 2014-016726 A | 1/2012 |
| JP | 2012-235012 A1 | 11/2012 |

* cited by examiner

*Primary Examiner* — Yu-Hsi D Sun
(74) *Attorney, Agent, or Firm* — McGinn IP Law Group, PLLC (57) ABSTRACT

To remove a deteriorated layer generated in forming a scribing trench by laser irradiation. A scribing trench is formed by irradiating a laser beam along a device dividing line on the rear surface of a substrate. At this time, a deteriorated layer is formed on the bottom surface or side surface of the scribing trench. Next, a protective film is formed so as to cover the entire top surface of the device structure, and the deteriorated layer is removed by wet etching. Wet etching is performed by alternately repeating BHF (buffered hydrofluoric acid) wet etching and MEA (monoethanolamine) wet etching several times.

20 Claims, 6 Drawing Sheets

METHOD FOR PRODUCING LIGHT-EMITTING DEVICE

BACKGROUND OF THE INVENTION

Field of the Invention

The present invention relates to a method for producing a light-emitting device, especially to device isolation of a light-emitting device using a GaN substrate.

Background Art

In producing a light-emitting device, after a plurality of device structures are formed on a growth substrate, the growth substrate is divided into light-emitting devices by dicing or scribing. As one of the methods for producing a scribing trench, laser ablation method is known where a trench is formed by evaporating the laser irradiation region.

In laser ablation, a deteriorated layer is formed on the processed surface. When a GaN substrate is used as a growth substrate, the deteriorated layer is black, and absorbs light. Therefore, light extraction may be improved by removing the deteriorated layer. As a method for removing the deteriorated layer, a method for removing the deteriorated layer by wet etching is disclosed in Patent Documents 1 to 3. As an etching solution, hydrofluoric acid is used in Patent Document 1 and phosphoric acid is used in Patent Document 2. In Patent Document 3, when the deteriorated layer was formed inside the GaN substrate, the deteriorated layer can be removed by HCl or KOH. However, it is difficult to remove a black deteriorated layer formed when a scribing trench was formed on the GaN surface.

Patent Document 1: Japanese Patent Application Laid-Open (kokai) No. 2007-142277
Patent Document 2: Japanese Patent Application Laid-Open (kokai) No. 2012-235012
Patent Document 3: Japanese Patent Application Laid-Open (kokai) No. 2012-16726

When hydrofluoric acid or HCl is used, the deteriorated layer cannot be sufficiently removed and remains. When phosphoric acid is used, etching time needs to be long to sufficiently remove the deteriorated layer. As a result, there is a problem that the electrode is etched. Since GaN is etched by KOH, there is a problem that an uneven shape having concave and convex surfaces is collapsed when the uneven shape is formed on the rear surface of the GaN substrate.

SUMMARY OF THE INVENTION

In view of the foregoing, an object of the present invention is to remove a deteriorated layer formed by laser irradiation to form a scribing trench in the method for producing a light-emitting device having a Group III nitride semiconductor substrate.

In an aspect of the present invention, there is provided a method for producing a light-emitting device comprising: a scribing trench formation step of forming a scribing trench by irradiating a laser beam along a device dividing line on the rear surface of Group III nitride semiconductor substrate having a plurality of light-emitting device structures on the surface thereof, a deteriorated layer removal step of removing a deteriorated layer formed in the scribing trench by alternately and repeatedly performing wet etching using a hydrofluoric acid based solution and wet etching using an alkaline solution, and a device division step of dividing the substrate into light-emitting devices by dividing the substrate along the scribing trench.

The number of repetitions of wet etching using a hydrofluoric acid based solution and wet etching using an alkaline solution in the deteriorated layer removal step is preferably three times or more. The deteriorated layer can be sufficiently removed.

The hydrofluoric acid based solution may be buffered hydrofluoric acid. To sufficiently remove the deteriorated layer, the temperature of the hydrofluoric acid based solution is preferably 50° C. or more.

The alkaline solution may contain methanol amine. To sufficiently remove the deteriorated layer, the temperature of the alkaline solution is preferably 100° C. or more.

The scribing trench formation step may be a step of attaching a thermal release tape to the top surface of the light-emitting device structure to support the wafer before laser irradiation, forming a scribing trench by laser irradiation, and then peeling off the thermal release tape from the light-emitting device structure by heating. The thermal release tape is foamed by heating to lose adhesive strength, and is naturally floated and peeled off from the wafer. Thus, the thermal release tape can be peeled off from the top surface of the light-emitting device structure without causing any crack in the substrate.

The thermal release tape preferably has a thermal release temperature of 100° C. or more, and an adhesive strength of 5 N/20 mm or more. When the thermal release temperature is less than 100° C., the thermal release tape might be foamed and peeled off by heat due to laser irradiation. When the adhesive strength is less than 5 N/20 mm, the thermal release tape 20 is sometimes peeled off from the wafer in forming the scribing trench.

According to the present invention, the deteriorated layer formed on the substrate when a scribing trench was formed by laser irradiation can be removed without affecting the device structure such as electrode or substrate. As a result, light extraction efficiency of the light-emitting device can be improved.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENT

A specific embodiment of the present invention will next be described with reference to the drawings. However, the present invention is not limited to the embodiment.

Embodiment 1

Figure 1:
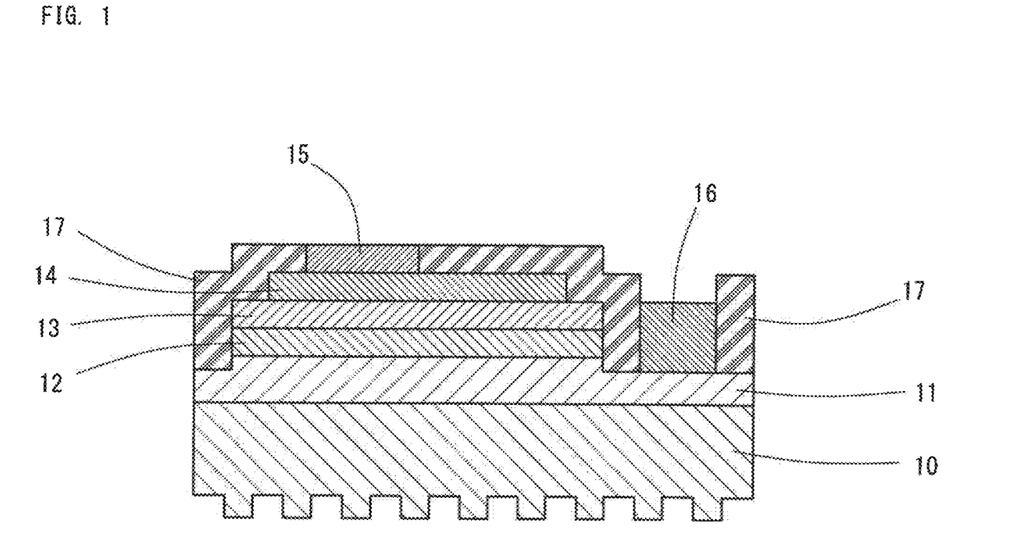
FIG. 1 shows the structure of a light-emitting device according to Embodiment 1.

FIG. 1 shows the structure of a light-emitting device according to Embodiment 1. As shown in FIG. 1, the light-emitting device according to Embodiment 1 includes a GaN substrate 10, an n-type layer 11, a light-emitting layer 12, and a p-type layer 13 sequentially deposited on the surface of the substrate 10. A transparent electrode 14 is formed on the p-type layer 13, and a p-electrode 15 is formed on the transparent electrode 14. A trench is formed so as to extend from the surface of the p-type layer 13 to the n-type layer 11, and an n-electrode 16 is formed on the n-type layer 11 exposed in the bottom of the trench. The top surfaces except for the top surfaces of the p-electrode 15 and the n-electrode 16 are covered with an insulating film 17. The light-emitting device according to Embodiment 1 is a flip-chip type device, and has a structure of extracting light from the rear surface of the substrate 10.

The material of the substrate 10 is not limited to GaN, and may be any Group III nitride semiconductor, for example, AlGaN, InGaN, and AlGaInN. The uneven shape, i.e., irregularities, is formed on the rear surface of the substrate 10 (surface opposite to the surface contacting the n-type layer 11).

The n-type layer 11, the light-emitting layer 12, and the p-type layer 13 may have any conventionally known structure. The electrode also may have any conventionally known structure.

The light-emitting device according to Embodiment 1 is of a flip-chip type. However, the light-emitting device may have any structure such as a face-up type or a vertical type which makes electrical conduction in a vertical direction. When the light-emitting device is of a face-up type, the uneven shape (irregularities) is not required to be provided on the rear surface of the substrate 10.

Next will be described processes for producing the light-emitting device according to Embodiment 1 with reference to FIGS. 2A to 4.

Firstly, a light-emitting device structure is formed on a GaN substrate 10. Specifically, an n-type layer 11, a light-emitting layer 12, and a p-type layer 13 are sequentially deposited through MOCVD on the substrate 10. Subsequently, a transparent electrode 14 is formed by sputtering or vapor deposition on a predetermined region on the p-type layer 13, and a p-electrode 15 is formed by sputtering or vapor deposition on the transparent electrode 14. A device isolation region of the p-type layer 13 and a region for forming an n-electrode 16 are dry etched to expose the n-type layer 11. An n-electrode 16 is formed by sputtering or vapor deposition on the n-type layer 11. After that, an insulating film 17 is formed so as to cover the entire top surface except for the p-electrode 15 and the n-electrode 16 (refer to FIG. 2A).

Figure 2A:
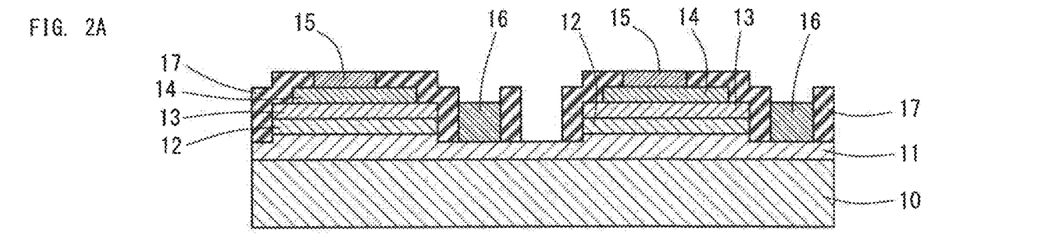
FIGS. 2A to 2D are sketches showing processes for producing the light-emitting device according to Embodiment 1.

The thickness of the substrate 10 is reduced to 140 µm by grinding the rear surface of the substrate 10. The thickness of the substrate 10 is not limited to this value, however, the thickness of the substrate 10 is preferably reduced to 50 µm to 250 µm to facilitate light extraction or division.

Figure 2B:
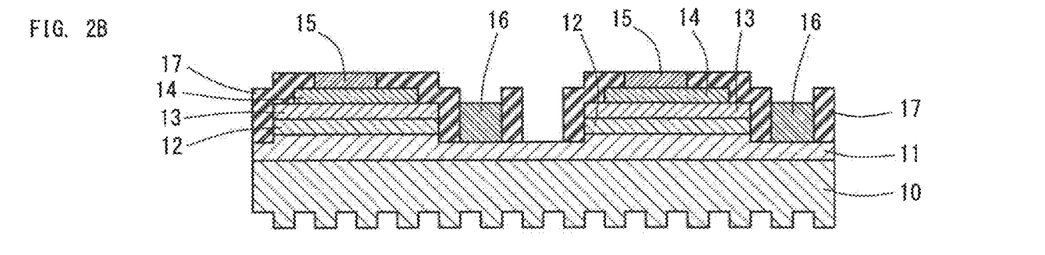

The uneven shape having concave and convex surfaces, i.e., irregularities, is formed on the rear surface of the substrate 10 (refer to FIG. 2B). A mask is formed by nanoimprint lithography, and the rear surface of the substrate 10 is etched by dry etching or wet etching. Since the rear surface of the substrate 10 is a nitride polar surface of GaN, it can be wet etched using KOH or TMAH. The irregularities improve light extraction. When the light-emitting device is of a face-up type, it is not necessary to form irregularities on the rear surface of the substrate 10.

Figure 2C:
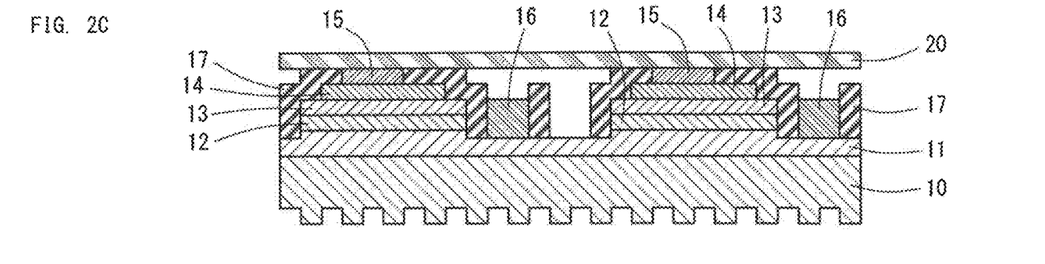

Next, a thermal release tape 20 is attached to the top surface of the device structure (on the p-electrode 15 and on the insulating film 17) to support the wafer (refer to FIG. 2C). The thermal release tape 20 preferably has a thermal release temperature of 100° C. or more. When the thermal release temperature is less than 100° C., the thermal release tape might be foamed and peeled off by heat due to laser irradiation in the subsequent step. The adhesive strength of the thermal release tape 20 is preferably 5 N/20 mm or more. When the adhesive strength is less than 5 N/20 mm, the thermal release tape 20 is sometimes peeled off from the wafer in the subsequent step of forming a scribing trench. As the thermal release tape 20, for example, 3193MS made by NITTO DENKO CORPORATION may be used.

Figure 2D:
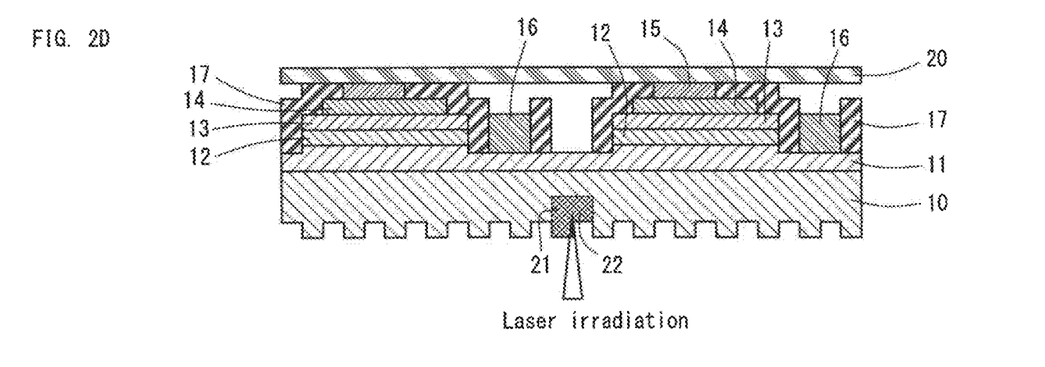

GaN is evaporated and a scribing trench 21 is formed in a lattice pattern by irradiating laser along the device dividing line on the rear surface of the substrate 10 (refer to FIG. 2D). The depth of the scribing trench 21 is preferably 10% to 50% of the thickness of the substrate 10. Within this range, the substrate 10 can be easily divided into light-emitting devices by subsequent breaking.

A deteriorated layer 22 is formed on the bottom surface or side surface of the scribing trench 21. The deteriorated layer 22 is considered in a mixed state of gallium oxide or deteriorated GaN. The deteriorated layer 22 has black parts. Therefore, the deteriorated layer 22 absorbs light, and decreases light extraction efficiency. Thus, the deteriorated layer 22 is removed in the step described later.

Figure 3A:
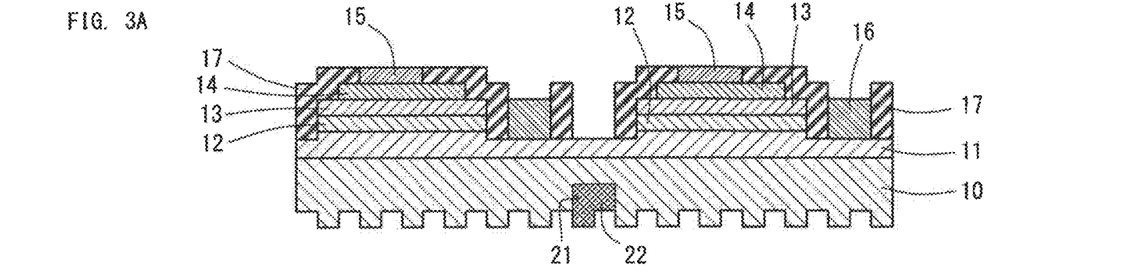
FIGS. 3A to 3D are sketches showing processes for producing the light-emitting device according to Embodiment 1.

The thermal release tape 20 is peeled off from the wafer by heating (refer to FIG. 3A). The thermal release tape 20 is foamed by heating to lose adhesive strength, and is naturally floated and peeled off from the wafer. When an UV tape is used, the UV tape is vacuum sucked and stuck to the wafer even after the adhesive strength is lost by UV irradiation. As a result, the substrate 10 was sometimes cracked by the force when peeling off the UV tape. However, when a thermal release tape 20 is used, the tape is not vacuum sucked and stuck to the wafer by foaming. Therefore, the thermal release tape 20 can be peeled off from the top surface of the device structure without cracking the substrate 10.

Figure 3B:
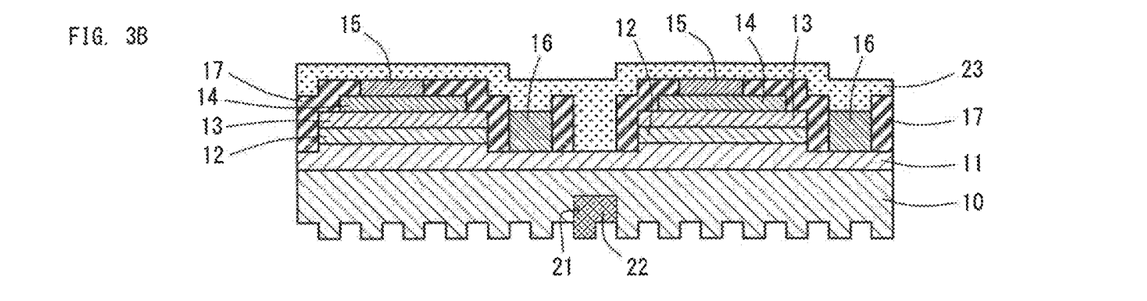

A protective film 23 is formed so as to cover the entire top surface of the device structure (refer to FIG. 3B). The protective film 23 is provided to protect the p-electrode 15 or the n-electrode 16, and the insulating film 17 from being etched by wet etching in the subsequent step. The protective film 23 is formed by heating and hardening after applying resist. The thickness of the protective film 23 is 3 µm. The resist material of the protective film 23 may be any material with resistance in the subsequent wet etching step. Specifically, a material with resistance to hydrofluoric acid based solution may be used. The thickness of the protective film 23 may be any thickness as long as the p-electrode 15 or the n-electrode 16, and the insulating film 17 are not exposed in the subsequent wet etching step.

Figure 3C:
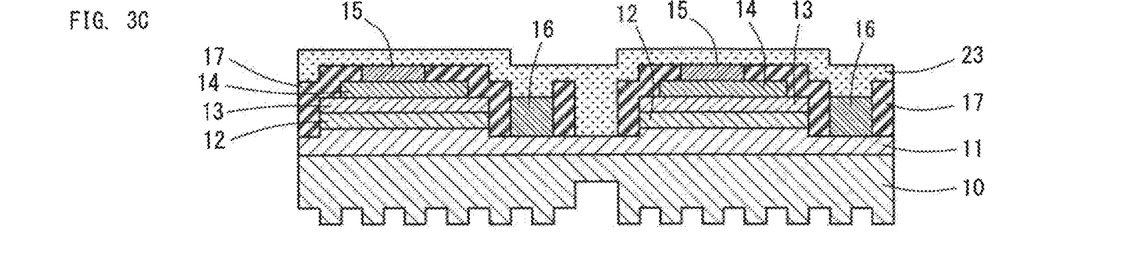
Figure 3D:
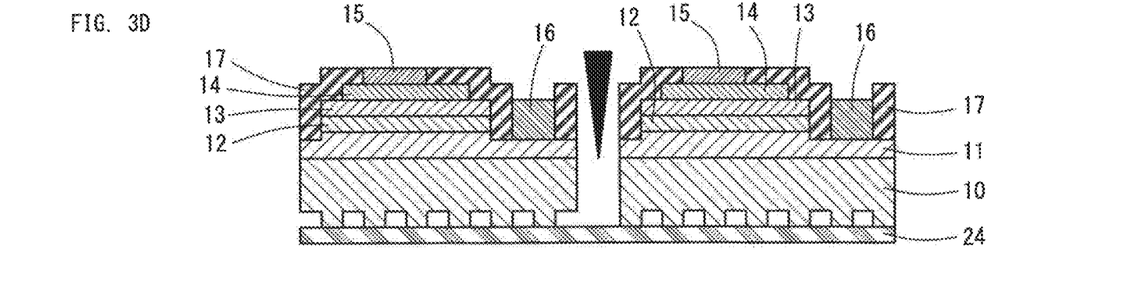
Figure 4:
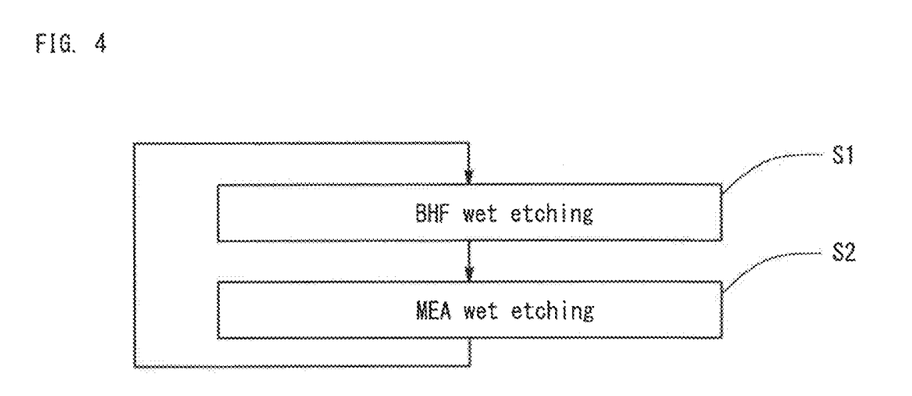
FIG. 4 is a diagram showing processes for producing the light-emitting device according to Embodiment 1.

The deteriorated layer 22 is removed by wet etching (refer to FIG. 3C). Wet etching is performed by alternately repeating BHF (buffered hydrofluoric acid) wet etching (step S1) and MEA (monoethanolamine) wet etching (step S2) several times as shown in FIG. 4. By removing the deteriorated layer 22, light absorbed by the deteriorated layer 22 is reduced, thereby improving light extraction efficiency of the light-emitting device. Since the protective film 23 dissolves in MEA and is thinned, the protective film 23 may be may be applied again each time wet etching is performed.

In BHF wet etching, hydrofluoric acid with a concentration of 15% made by DAIKIN INDUSTRIES, LTD. is used, and wet etching is performed at a BHF temperature of 55°

C. for 20 minutes. In the BHF wet etching, gallium oxide can be removed from the components of the deteriorated layer 22. The BHF temperature is not limited to the above. However, when the BHF temperature is low, the deteriorated layer 22 cannot be sufficiently removed. Therefore, the BHF temperature is preferably 50° C. or more, more preferably, 50° C. to 80° C., and further preferably, 50° C. to 70° C. The etching time is not limited to the above. However, to sufficiently remove the deteriorated layer 22, the etching time is preferably 5 to 60 minutes, more preferably, 5 to 40 minutes, and further preferably, 10 to 30 minutes.

Any material may be used other than BHF as long as it is a hydrofluoric acid based solution, for example, hydrofluoric acid.

In MEA wet etching, stripper 106 (MEA concentration of 75%) made by TOKYO OHKA KOGYO CO., LTD. is used, and wet etching is performed at a solution temperature of 120° C. for six minutes. In the MEA wet etching, modified GaN can be removed from the components of the deteriorated layer 22. The MEA temperature is not limited to the above. However, when the MEA temperature is low, the deteriorated layer 22 cannot be sufficiently removed. Therefore, the MEA temperature is preferably 100° C. or more, more preferably, 100° C. to 150° C., and further preferably, 110° C. to 130° C. The etching time is not limited to the above. However, to sufficiently remove the deteriorated layer 22, the etching time is preferably 2 to 20 minutes, more preferably, 3 to 15 minutes, and further preferably, 5 to 10 minutes.

Any alkaline solution having a sufficiently low etching rate for GaN may be used other than MEA, and a solution with pH of 13 or less is preferably used, for example, alkanolamine such as diethanolamine, and triethanolamine, methanolamine, or ammonia.

Specifically, wet etching is performed as follows. BHF wet etching, water washing, IPA (isopropyl alcohol) washing, MEA wet etching, IPA washing, and water washing are performed as one set, and several sets are repeated. Washing is performed in such order because the stripper 106 is turned into strong alkaline due to direct exposure to water.

BHF wet etching and MEA wet etching are performed as one set, and the number of repetitions of sets is preferably three or more. When the number of repetitions of set is three or more, the deteriorated layer 22 can be sufficiently removed. A cross intersection part of the lattice pattern of the scribing trench 21 has a depth larger than that in other region because laser irradiation is overlapped. However, even in such a deep trench region, the deteriorated layer 22 can be sufficiently removed by repeating three or more sets of etching. The number of repetitions of set is more preferably three to ten, and further preferably, four to nine.

BHF wet etching and MEA wet etching are repeatedly performed because of the following reason. The deteriorated layer 22 is in a mixed state of gallium oxide and modified GaN. Therefore, when only BHF wet etching is performed, the modified GaN acts as an etching stopper, and when only MEA wet etching is performed, gallium oxide acts as an etching stopper. Even if the etching time is extended, the deteriorated layer 22 cannot be sufficiently removed. In Embodiment 1, BHF wet etching and MEA wet etching are alternately repeated to avoid either of gallium oxide or modified GaN from acting as an etching stopper, thereby sufficiently removing the deteriorated layer 22.

In Embodiment 1, firstly BHF wet etching is performed, and then MEA wet etching is performed. After this, BHF wet etching and MEA wet etching are alternately repeated. Wet etching is performed in such order because MEA melts the protective film 23.

In the BHF wet etching, GaN is not wet etched. In the MEA wet etching, the wet etching rate of GaN is low. Therefore, in the above wet etching step for removing the deteriorated layer 22, the uneven shape (irregularities) can be maintained as it is without affecting the uneven structure on the rear surface of the substrate 10. A protective film 23 is provided to protect the electrode. The protective film 23 is made of a material resistant to BHF so that the electrode structure is also maintained. That is, the deteriorated layer 22 can be removed without affecting the structure of the light-emitting device.

The protective film 23 covering the top surface of the device structure is removed, and an UV tape 24 is attached to the rear surface of the substrate 10. Then, the device structure is divided into individual light-emitting devices by pressing a blade from the top surface of the substrate 10 and breaking the substrate 10 (refer to FIG. 3D). Through the above, the light-emitting device according to Embodiment 1 is produced.

According to the method for producing a light-emitting device according to Embodiment 1, the deteriorated layer 22 generated by laser irradiation in the scribing trench 21 of the substrate 10 can be easily removed. As a result, light absorption by the deteriorated layer 22 is reduced, and light extraction efficiency of the light-emitting device can be improved. Especially in the method for producing a light-emitting device according to Embodiment 1, the deteriorated layer 22 can be removed without affecting the device structure of the light-emitting device such as the uneven structure (irregularities) on the rear surface of the substrate 10 or the electrode structure.

Figure 5:
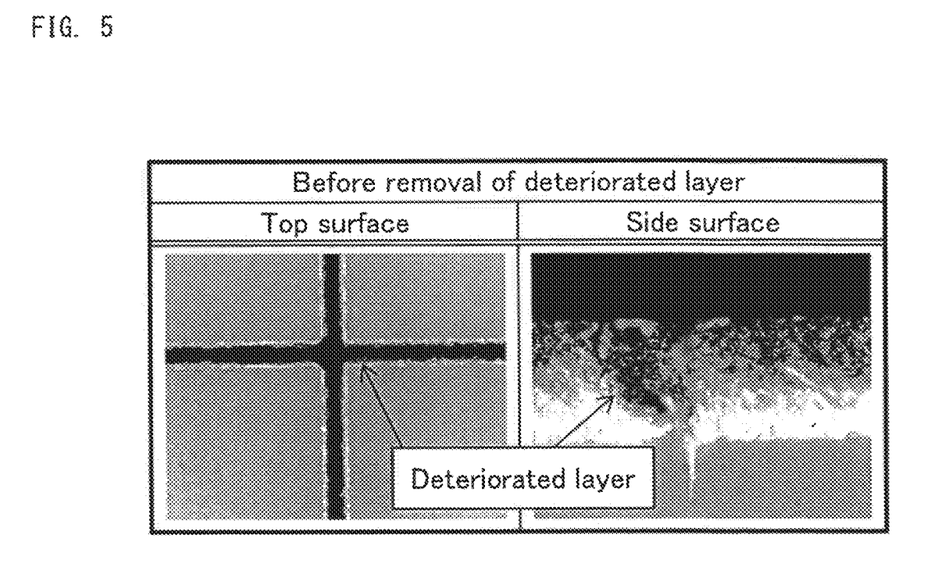
FIG. 5 shows photos of a scribing trench.

Next will be described the experiment results regarding the removal of the deteriorated layer 22 by wet etching. FIG. 5 shows photos of the top surface and the side surface of the scribing trench 21 before the removal of the deteriorated layer 22. It is observed that the deteriorated layer 22 is formed along the side surface of the scribing trench 21.

Figure 6:
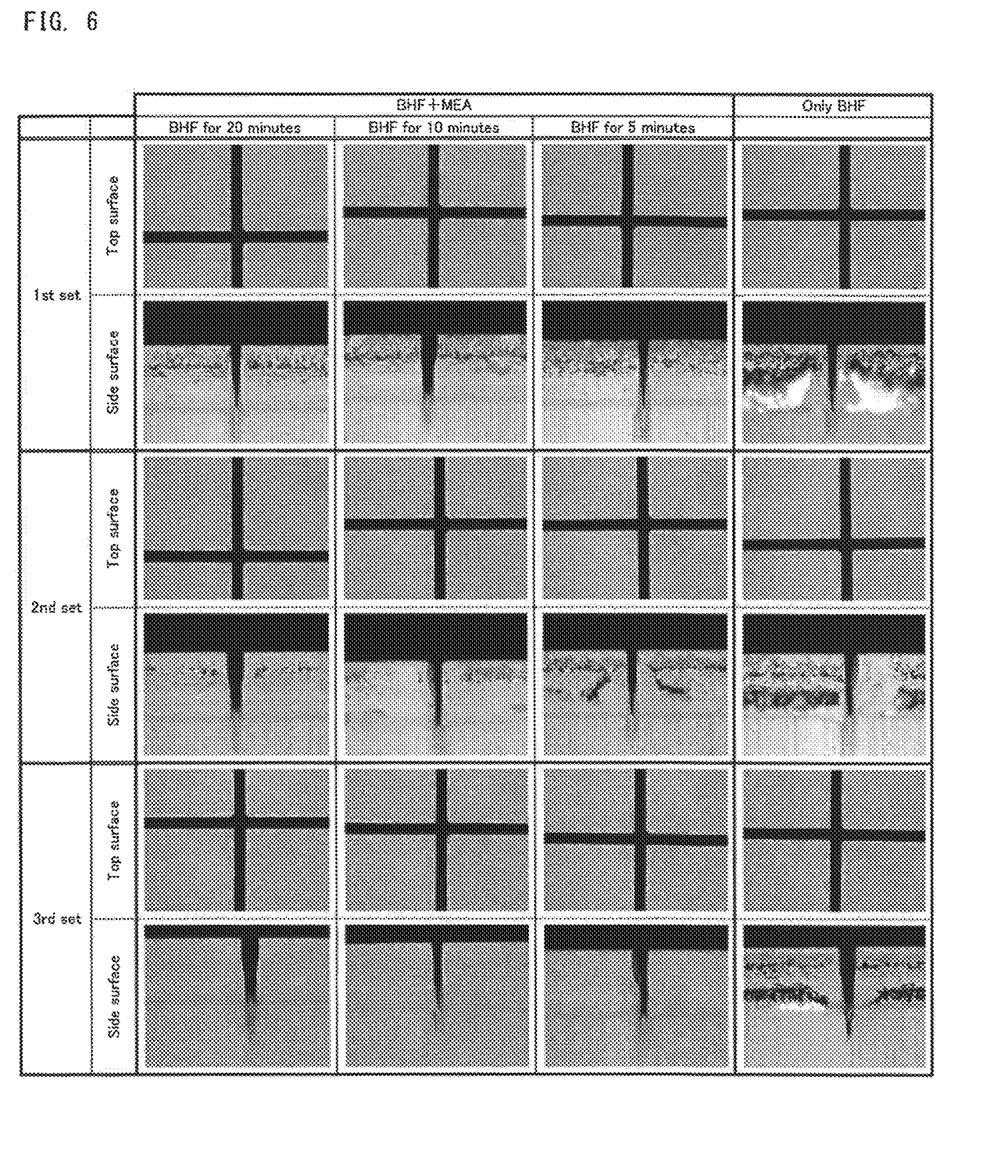
FIG. 6 shows photos of a scribing trench.

FIG. 6 shows photos of the top surface and the side surface of the scribing trench 21 after the removal of the deteriorated layer 22 by wet etching. BHF wet etching and MEA wet etching are performed as one set, and a set of wet etching was repeated one to three times. BHF wet etching were performed at a temperature of 55° C. for five minutes, ten minutes, and twenty minutes. MEA wet etching was performed at a temperature of 120° C. for six minutes. For comparison, it was confirmed whether the deteriorated layer 22 is removed or not when only BHF wet etching was performed at a temperature of 55° C. for twenty minutes.

As shown in FIG. 6, regardless of the BHF wet etching time, the deteriorated layer 22 is reduced as the number of repetitions is increased, and when the number of repetitions is three, the deteriorated layer 22 was not observed. However, when the number of repetitions is one or two, the longer the etching time, the less the deteriorated layer 22. As a result, it was found that most preferably, BHF etching was performed for twenty minutes and repeated three times.

As shown in FIG. 6, when only BHF wet etching is performed, the deteriorated layer 22 can be slightly removed in the first wet etching and the second wet etching. However, the remaining amount of the deteriorated layer 22 hardly changes between the second wet etching and the third wet etching. Thus, it was found that the deteriorated layer 22 cannot be completely removed by repeating only BHF wet etching even if the number of repetitions is increased.

Figure 7:
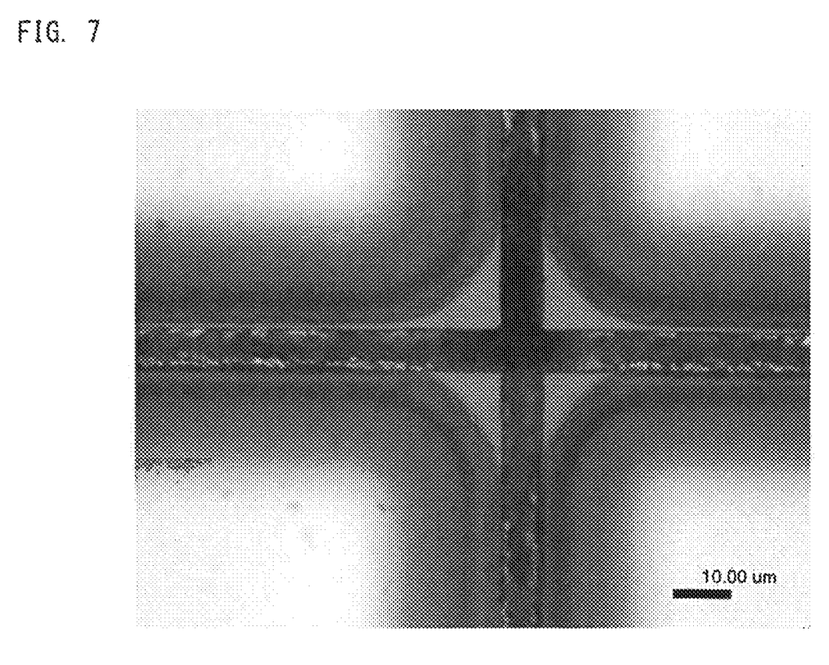
FIG. 7 shows a photo of a scribing trench.

FIG. 7 shows a photo taken from the above of the scribing trench 21 after wet etching using a TMAH solution was performed. The temperature of the TMAH solution was 60° C. and the etching time was sixty minutes. As shown in FIG. 7, the deteriorated layer 22 remains in places on the side surface of the scribing trench 21. It was found that the deteriorated layer 22 cannot be sufficiently removed by wet etching using a TMAH solution.

Figure 8:
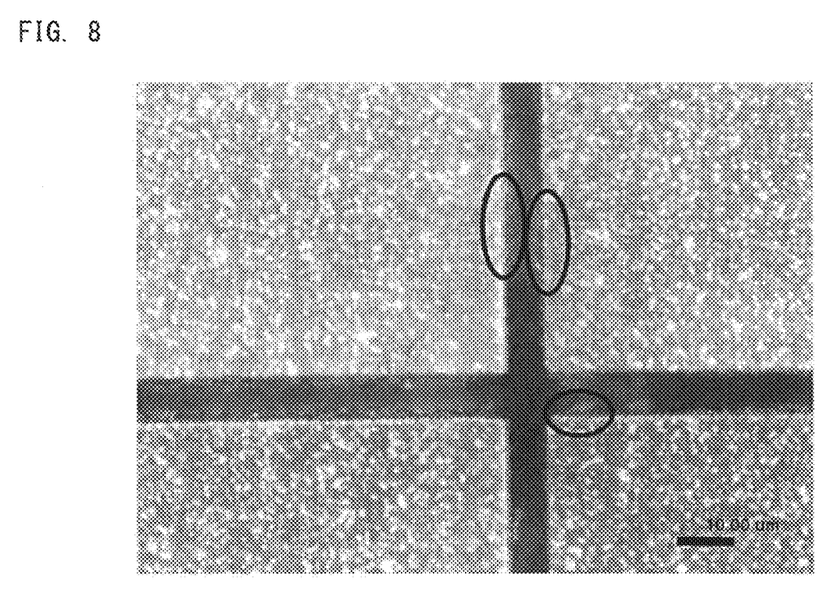
FIG. 8 shows a photo of a scribing trench.

FIG. 8 shows a photo taken from the above of the scribing trench 21 after BHF wet etching and then MEA wet etching were performed. BHF wet etching was performed at a room temperature for twenty minutes. MEA wet etching was performed at a room temperature for 6.5 minutes. As shown in FIG. 8, the deteriorated layer 22 slightly remained on the side surface of the scribing trench 21. As a result, it was found that etching is preferably performed at a temperature higher than a room temperature.

The light-emitting device produced according to the present invention can be employed as a light source of an illumination apparatus or a display apparatus.

What is claimed is:

1. A method for producing a light-emitting device, the method comprising;
   forming a scribing trench by irradiating a laser beam along a device dividing line on the rear surface of a Group III nitride semiconductor substrate having a plurality of light-emitting device structures on the surface thereof;
   removing a deteriorated layer formed in the scribing trench by alternately and repeatedly performing wet etching using a hydrofluoric acid based solution and wet etching using an alkaline solution; and
   dividing the substrate into light-emitting devices by dividing the substrate along the scribing trench.

2. The method for producing a light-emitting device according to claim 1, wherein the number of repetitions of wet etching using a hydrofluoric acid based solution and wet etching using an alkaline solution in removing the deteriorated layer is preferably three times or more.

3. The method for producing a light-emitting device according to claim 2, wherein the hydrofluoric acid based solution is buffered hydrofluoric acid.

4. The method for producing a light-emitting device according to claim 2, wherein the temperature of the hydrofluoric acid based solution is 50° C. or more.

5. The method for producing a light-emitting device according to claim 2, wherein the alkaline solution contains methanol amine.

6. The method for producing a light-emitting device according to claim 2, wherein the temperature of the alkaline solution is 100° C. or more.

7. The method for producing a light-emitting device according to claim 1, wherein the hydrofluoric acid based solution is buffered hydrofluoric acid.

8. The method for producing a light-emitting device according to claim 7, wherein the temperature of the hydrofluoric acid based solution is 50° C. or more.

9. The method for producing a light-emitting device according to claim 7, wherein the alkaline solution contains methanol amine.

10. The method for producing a light-emitting device according to claim 9, wherein forming a protective film for covering an entire top surface of the light-emitting device structure before removing the deteriorated layer.

11. The method for producing a light-emitting device according to claim 9, wherein a thermal release tape is attached to the top surface of the light-emitting device structure to support the wafer before laser irradiation, a scribing trench is formed by laser irradiation, and then the thermal release tape is peeled off from the light-emitting device structure by heating.

12. The method for producing a light-emitting device according to claim 11, wherein forming a protective film for covering an entire top surface of the light-emitting device structure after peeling off the thermal release and before removing the deteriorated layer.

13. The method for producing a light-emitting device according to claim 7, wherein the temperature of the alkaline solution is 100° C. or more.

14. The method for producing a light-emitting device according to claim 1, wherein the temperature of the hydrofluoric acid based solution is 50° C. or more.

15. The method for producing a light-emitting device according to claim 14, wherein the alkaline solution contains methanol amine.

16. The method for producing a light-emitting device according to claim 14, wherein the temperature of the alkaline solution is 100° C. or more.

17. The method for producing a light-emitting device according to claim 1, wherein the alkaline solution contains methanol amine.

18. The method for producing a light-emitting device according to claim 1, wherein the temperature of the alkaline solution is 100° C. or more.

19. The method for producing a light-emitting device according to claim 1, wherein a thermal release tape is attached to the top surface of the light-emitting device structure to support the wafer before laser irradiation, a scribing trench is formed by laser irradiation, and then the thermal release tape is peeled off from the light-emitting device structure by heating.

20. The method for producing a light-emitting device according to claim 19, wherein the thermal release tape has a thermal release temperature of 100° C. or more, and an adhesive strength of 5 N/20 mm or more.

* * * * *